United States Patent
Shibata et al.

(10) Patent No.: US 8,446,074 B2
(45) Date of Patent: May 21, 2013

(54) PIEZOELECTRIC THIN-FILM ELEMENT AND PIEZOELECTRIC THIN-FILM DEVICE

(75) Inventors: Kenji Shibata, Tokyo (JP); Kazufumi Suenaga, Tokyo (JP); Kazutoshi Watanabe, Tokyo (JP); Akira Nomoto, Tokyo (JP); Fumimasa Horikiri, Tokyo (JP)

(73) Assignee: Hitachi Cable Ltd., Tokyo (JP)

( * ) Notice: Subject to any disclaimer, the term of this patent is extended or adjusted under 35 U.S.C. 154(b) by 0 days.

(21) Appl. No.: 13/636,883

(22) PCT Filed: Mar. 24, 2011

(86) PCT No.: PCT/JP2011/057117
§ 371 (c)(1),
(2), (4) Date: Sep. 24, 2012

(87) PCT Pub. No.: WO2011/118686
PCT Pub. Date: Sep. 29, 2011

(65) Prior Publication Data
US 2013/0009519 A1    Jan. 10, 2013

(30) Foreign Application Priority Data
Mar. 25, 2010  (JP) .................... 2010-070361

(51) Int. Cl.
*H01L 41/187* (2006.01)

(52) U.S. Cl.
USPC .................................. 310/358; 252/62.9 PZ

(58) Field of Classification Search
USPC ............... 310/311, 358, 348, 357, 319, 363, 310/365, 366, 314, 359; 252/62.9 R, 62.9 PZ; 501/134, 135
See application file for complete search history.

(56) References Cited

U.S. PATENT DOCUMENTS

| | | | |
|---|---|---|---|
| 7,352,113 B2 * | 4/2008 | Nagaya et al. | 310/358 |
| 7,482,736 B2 * | 1/2009 | Ueno et al. | 310/358 |
| 8,310,136 B2 * | 11/2012 | Suenaga et al. | 310/358 |
| 2004/0214723 A1 | 10/2004 | Nonoyama et al. | |
| 2007/0126313 A1 | 6/2007 | Ueno et al. | |
| 2009/0189482 A1 | 7/2009 | Shibata et al. | |
| 2009/0236944 A1 | 9/2009 | Shibata et al. | |
| 2011/0187237 A1 * | 8/2011 | Suenaga et al. | 310/363 |

FOREIGN PATENT DOCUMENTS

| | | |
|---|---|---|
| JP | 2004-300019 A | 10/2004 |
| JP | 2007-184513 A | 7/2007 |
| JP | 2007-284281 A | 11/2007 |
| JP | 2007-287918 A | 11/2007 |
| JP | 2008-159807 A | 7/2008 |
| JP | 2009-200469 A1 | 9/2009 |

OTHER PUBLICATIONS

International Search Report published Sep. 29, 2011 for PCT/JP2011/057117.
Written Opinion published Sep. 25, 2011 for PCT/JP2011/057117.
International Preliminary Report published Sep. 25, 2011 for PCT/JP2011/057117.

* cited by examiner

*Primary Examiner* — Thomas Dougherty
*Assistant Examiner* — Karen B Addison
(74) *Attorney, Agent, or Firm* — Marty Fleit; Paul D. Bianco; Fleit Gibbons Gutman Bongini & Bianco PL

(57) ABSTRACT

There is provided a piezoelectric thin film element, comprising: a substrate 1; and a piezoelectric thin film 3 having an alkali niobium oxide-based perovskite structure represented by a composition formula $(K_{1-x}Na_x)_yNbO_3$ provided on the substrate 1, wherein a carbon concentration of the piezoelectric thin film 3 is $2\times10^{19}/cm^3$ or less, or a hydrogen concentration of the piezoelectric thin film 3 is $4\times10^{19}/cm^3$ or less.

10 Claims, 4 Drawing Sheets

FIG. 8

| | KNN sintered target | | | | | During film formation Ar/O₂ ratio | After film formation Heat treatment | KNN thin film | | | | |
|---|---|---|---|---|---|---|---|---|---|---|---|---|
| | Na/(K+Na) | (K+Na)/Nb | Sintering temperature (°C) | C concentration (wt ppm) | H concentration (wt ppm) | | | Na/(K+Na) | (K+Na)/Nb | C concentration (atm/cm³) | H concentration (atm/cm³) | Dielectric constant | tan δ |

| | Na/(K+Na) | (K+Na)/Nb | Sintering temp (°C) | C (wt ppm) | H (wt ppm) | Ar/O₂ | Heat treat | Na/(K+Na) | (K+Na)/Nb | C (atm/cm³) | H (atm/cm³) | Dielectric constant | tan δ |
|---|---|---|---|---|---|---|---|---|---|---|---|---|---|
| Com.Ex.1 | 0.78 | 0.86 | 1100 | 673 | 350 | 99/1 | None | 0.70 | 0.77 | 3.0E+19 | 7.1E+19 | 140 | 0.19 |
| Com.Ex.2 | 0.76 | 1.02 | 1000 | 967 | 440 | 99/1 | None | 0.69 | 0.90 | 4.7E+19 | 7.3E+19 | 152 | 0.31 |
| Com.Ex.3 | 0.60 | 0.88 | 1050 | 823 | 401 | 90/10 | None | 0.55 | 0.78 | 2.3E+19 | 4.8E+19 | 641 | 0.14 |
| Ex.1 | 0.55 | 0.92 | 1230 | 283 | 133 | 90/10 | Treated | 0.42 | 0.80 | 3.1E+18 | 7.7E+18 | 850 | 0.03 |
| Ex.2 | 0.45 | 1.03 | 1070 | 763 | 335 | 95/5 | Treated | 0.40 | 0.88 | 1.3E+19 | 1.1E+19 | 317 | 0.05 |
| Ex.3 | 0.44 | 0.89 | 1080 | 733 | 321 | 95/5 | Treated | 0.44 | 0.82 | 1.0E+19 | 2.3E+19 | 293 | 0.04 |
| Ex.4 | 0.49 | 0.88 | 1090 | 703 | 360 | 95/3 | Treated | 0.55 | 0.75 | 1.7E+18 | 9.8E+18 | 529 | 0.03 |
| Ex.5 | 0.59 | 1.01 | 1200 | 373 | 155 | 95/3 | Treated | 0.66 | 0.89 | 4.1E+18 | 8.5E+18 | 727 | 0.05 |
| Ex.6 | 0.71 | 1.05 | 1220 | 313 | 132 | 97/3 | Treated | 0.56 | 0.87 | 6.4E+18 | 1.0E+19 | 197 | 0.05 |
| Ex.7 | 0.59 | 0.95 | 1230 | 283 | 115 | 97/3 | Treated | 0.51 | 0.82 | 6.0E+18 | 1.4E+19 | 749 | 0.06 |
| Ex.8 | 0.55 | 0.92 | 1240 | 253 | 109 | 97/3 | Treated | 0.66 | 0.80 | 5.5E+18 | 1.0E+19 | 830 | 0.10 |
| Ex.9 | 0.71 | 0.92 | 1200 | 373 | 157 | 99/1 | Treated | 0.69 | 0.84 | 2.0E+19 | 4.0E+19 | 197 | 0.08 |
| Ex.10 | 0.75 | 0.91 | 1220 | 313 | 169 | 99/1 | Treated | 0.55 | 0.85 | 1.7E+19 | 3.0E+19 | 158 | 0.15 |
| Com.Ex.4 | 0.61 | 0.94 | 1190 | 403 | 200 | 99/1 | None | 0.59 | 0.81 | 2.2E+19 | 6.3E+19 | 573 | 0.14 |
| Com.Ex.5 | 0.66 | 0.92 | 1170 | 463 | 229 | 99/1 | None | 0.52 | 0.79 | 2.6E+19 | 5.0E+19 | 301 | 0.19 |
| Com.Ex.6 | 0.57 | 0.90 | 1150 | 523 | 261 | 99/1 | None | 0.80 | 0.86 | 3.0E+19 | 7.6E+19 | 803 | 0.17 |
| Com.Ex.7 | 0.65 | 1.00 | 1170 | 463 | 235 | 99/1 | None | 0.60 | 0.83 | 2.9E+19 | 4.7E+19 | 306 | 0.17 |
| Com.Ex.8 | 0.66 | 0.91 | 1180 | 433 | 245 | 99/1 | None | 0.61 | 0.83 | 2.7E+19 | 6.1E+19 | 294 | 0.17 |

Com.Ex. = Comparative Example
Ex. = Example

PIEZOELECTRIC THIN-FILM ELEMENT AND PIEZOELECTRIC THIN-FILM DEVICE

TECHNICAL FIELD

The present invention relates to a piezoelectric thin film element and a piezoelectric thin film device using an alkali niobium oxide-based piezoelectric thin film.

DESCRIPTION OF RELATED ART

A piezoelectric material is processed into various piezoelectric elements for various purposes of use, and is widely utilized as functional electronic components such as an actuator for generating deformation under application of voltage and a sensor for generating voltage from the deformation of an element.

A dielectric material made of lead-based materials having excellent piezoelectric characteristics, and particularly $Pb(Zr_{1-x}Ti_x)O_3$-based perovskite ferroelectrics called PZT, are widely used as a piezoelectric material utilized for the purpose of use of the actuator and sensor. Usually, the piezoelectric material such as PZT is formed by sintering oxide of a piezoelectric material. At present, miniaturization and higher performance are strongly requested for the piezoelectric element, with a progress of the miniaturization and higher performance of each kind of electronic components.

However, there is a problem in the piezoelectric material fabricated by a producing method focusing on a sintering method being a conventional preparing method, as follows. As the piezoelectric material is made thinner and particularly as its thickness becomes close to about 10 µm, a size of the piezoelectric material becomes close to a size of crystal grains constituting the material, thus posing a problem that variation and deterioration of the characteristic are great. In order to avoid the aforementioned problem, a method for forming a piezoelectric material applying a thin film technique instead of the sintering method has been studied in recent years. In recent years, a PZT thin film formed on a silicon substrate by sputtering, is put to practical use as the piezoelectric thin film for an actuator for a high-speed and high-definition inkjet printer head.

However, a piezoelectric sintered compact and the piezoelectric thin film made of PZT contains lead by about 60 to 70 wt %, and therefore are not preferable from an aspect of an ecological standpoint and pollution control. Therefore, it is desired to develop a piezoelectric material not containing lead in consideration of an environment. At present, various lead-free piezoelectric materials are studied, and above all, potassium sodium niobate represented by a composition formula: $(K_{1-x}Na_x)NbO_3$ ($0<x<1$) can be given as an example (for example, see patent document 1 and patent document 2). Such potassium sodium niobate includes a material having a perovskite structure, and is expected as a strong candidate of the lead-free piezoelectric material.

PRIOR ART DOCUMENTS

Patent Documents

Patent Document 1:
Japanese Patent Laid Open Publication No. 2007-184513
Japanese Patent Laid Open Publication No. 2008-159807

SUMMARY OF THE INVENTION

Problem to be Solved by the Invention

However, when a potassium sodium niobate piezoelectric thin film produced by a conventional technique is used as an actuator, heat generation is great at an operating time, thus deteriorating the element in some cases. Further, when it is used as a sensor, sensitivity becomes extremely low in some cases, due to small deformation of the piezoelectric thin film.

In order to solve the above-described problem, the present invention is provided, and an object of the present invention is to provide a piezoelectric thin film element and a piezoelectric thin film device capable of realizing dielectric loss tan δ of 0.1 or less, having excellent piezoelectric characteristics.

Means for Solving the Problem

A first aspect of the present invention provides a piezoelectric thin film element, comprising:
a substrate; and
a piezoelectric thin film having an alkali niobium oxide-based perovskite structure represented by a composition formula $(K_{1-x}Na_x)_yNbO_3$ (satisfying $0.4 \leq x \leq 0.7$ and $0.75 \leq y \leq 0.90$) provided on the substrate,
wherein a carbon concentration of the piezoelectric thin film is $2 \times 10^{19}/cm^3$ or less, and a hydrogen concentration is $4 \times 10^{19}/cm^3$ or less.

A second aspect of the present invention provides a piezoelectric thin film element, comprising:
a substrate; and
a piezoelectric thin film having an alkali niobium oxide-based perovskite structure represented by a composition formula $(K_{1-x}Na_x)_yNbO_3$ provided on the substrate,
wherein a hydrogen concentration of the piezoelectric thin film is $4 \times 10^{19}/cm^3$ or less.

A third aspect of the present invention provides the piezoelectric thin film element according to the first aspect or the second aspect, wherein the piezoelectric thin film has a pseudo-cubic structure and is preferentially oriented in (001) plane direction.

A fourth aspect of the present invention provides the piezoelectric thin film element according to any one of the first to third aspects, wherein a composition of the piezoelectric thin film is expressed by $0.4 \leq x \leq 0.7$ and $0.75 \leq y \leq 0.90$.

A fifth aspect of the present invention provides the piezoelectric thin film according to any one of the first to fourth aspects, wherein a base layer is provided between the substrate and the piezoelectric thin film.

A sixth aspect of the present invention provides the piezoelectric thin film according to the fifth aspect, wherein the base layer is a Pt layer, and the Pt layer is preferentially oriented in (111) plane direction.

A seventh aspect of the present invention provides the piezoelectric thin film according to any one of the first to sixth aspects, wherein the substrate is a Si substrate, a surface oxide film-attached Si substrate, or a SOI substrate.

An eighth aspect of the present invention provides a piezoelectric thin film device, comprising:
the piezoelectric thin film element described in any one of the first to seventh aspects;
an upper electrode and a lower electrode provide in an upper part and in a lower part, with the piezoelectric thin film of the piezoelectric thin film element interposed between them; and
a function generator or a voltage detector connected between the upper electrode and the lower electrode.

ADVANTAGE OF THE INVENTION

According to the present invention, there is provided a piezoelectric thin film element and a piezoelectric thin film device capable of realizing dielectric loss tan δ of 0.1 or less, having excellent piezoelectric characteristics.

BRIEF DESCRIPTION OF THE DRAWINGS

FIG. 8 is a view of a list of a composition, etc., of a KNN sintered target, $Ar/O_2$ ratio during film formation by sputtering, presence/absence of a heat treatment after film formation, and a composition of the KNN thin film, carbon concentration, hydrogen concentration, dielectric constant, an tan δ, in a table form.

DETAILED DESCRIPTION OF THE INVENTION

Figure 1:
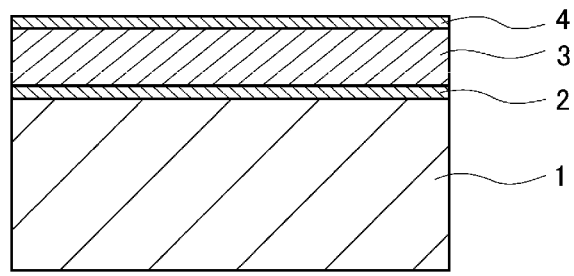
FIG. 1 is a schematic cross-sectional view of a structure of a piezoelectric thin film element according to a first embodiment of the present invention.

As described above, when an alkali niobium oxide piezoelectric thin film obtained by a conventional technique, is used as an actuator, heat generation at an operating time is great, and a piezoelectric thin film element is rapidly deteriorated in some cases, and when it is used as a sensor, sensitivity becomes extremely low in a case of a small deformation of a piezoelectric thin film in some cases.

In order to solve the above-described problem, and after strenuous efforts by inventors of the present invention, it is found that a conventional potassium sodium niobate piezoelectric thin film has a high dielectric loss tan δ. It is also found that the actuator using the piezoelectric thin film having high tan δ involves a problem that heat generation under operation is great, thus accelerating the deterioration of the piezoelectric thin film element, and the sensor using the piezoelectric thin film having high tan δ involves a problem that the sensitivity in a case of a small deformation of the piezoelectric thin film becomes extremely low. For example, when the piezoelectric thin film is used for the actuator of an inkjet printer head, tan δ is requested to be 0.1 or less. At present, a situation is that the potassium sodium niobate piezoelectric thin film does not satisfy such a request, and therefore application to products is difficult. In order to widely apply the potassium sodium niobate piezoelectric thin film to the inkjet printer head, etc., the potassium sodium niobate piezoelectric thin film having tan δ of 0.1 or less is required to be realized.

Therefore, after further efforts by the inventors of the present invention, knowledge is obtained as follows. There is a strong correlation between the carbon concentration or the hydrogen concentration contained in the piezoelectric thin film represented by $(K_{1-x}Na_x)_yNbO_3$ (abbreviated as "KNN" hereafter), and the dielectric loss tan δ of the KNN piezoelectric thin film, and the dielectric loss tan δ of the KNN piezoelectric thin film can be controlled by adjusting the carbon concentration or the hydrogen concentration of the KNN piezoelectric thin film. Thus, the present invention is achieved.

(Embodiments of the Piezoelectric Thin Film Element)

An embodiment of the piezoelectric thin film element according to the present invention will be described hereafter.

The piezoelectric thin film element of the present invention comprises: a substrate and a piezoelectric thin film having an alkali niobium oxide-based perovskite structure represented by a composition formula $(K_{1-x}Na_x)_yNbO_3$ provided on the substrate, wherein a carbon concentration of the piezoelectric thin film is $2 \times 10^{19}/cm^3$ or less.

Further, the piezoelectric thin film element of other embodiment of the present invention comprises: a substrate and a piezoelectric thin film having an alkali niobium oxide-based perovskite structure represented by a composition formula $(K_{1-x}Na_x)_yNbO_3$ provided on the substrate, wherein a hydrogen concentration of the piezoelectric thin film is $4 \times 10^{19}/cm^3$ or less.

The dielectric loss tan δ of the KNN piezoelectric thin film can be suppressed to 0.1 or less by setting the carbon concentration of the KNN piezoelectric thin film to $2 \times 10^{19}/cm^3$ or less, or setting the hydrogen concentration of the KNN piezoelectric thin film to $4 \times 10^{19}/cm^3$ or less (see FIG. 6 in the example as will be described later).

In the piezoelectric thin film element of the aforementioned embodiment, preferably the KNN piezoelectric thin film has a pseudo-cubic structure and is preferentially oriented in (001) plane direction. With this crystal structure, a high piezoelectric constant can be obtained.

Further, in the piezoelectric thin film element of the aforementioned embodiment, $x=Na/(K+Na)$ ratio, and $y=(K+Na)/Nb$ ratio of the KNN piezoelectric thin film is preferably $0.4 \leq x \leq 0.7$, and $0.75 \leq y \leq 0.90$.

When the KNN film is fabricated containing less K and Na than those of the KNN film $((K_{1-x}Na_x)NbO_3)$ having a stoichiometry composition of $y=1$, it is found that the piezoelectric constant is larger than that of the KNN film in the vicinity of $y=1$. Although details of a mechanism of improving the piezoelectric constant are not clarified, it can be considered that by setting y smaller than 1, a moderate destabilizing factor is introduced to the KNN film of $y=1$, which is ideal as a crystal, thus easily causing an expanding/contracting motion of a crystal lattice by an electric field (piezoelectric motion). The KNN thin film in which compositions x, y of $((K_{1-x}Na_x)_yNbO_3)$ are in a range of $0.4 \leq x \leq 0.7$ and $0.75 \leq y \leq 0.90$, has a piezoelectric constant $d_{31}$ of a high practical level which can be replaced with a PZT thin film.

A more specific embodiment of the piezoelectric thin film element of the present invention will be described next, using figures.

(First Embodiment of the Piezoelectric Thin Film Element)

FIG. 1 is a cross-sectional view of a schematic structure of the piezoelectric thin film element according to a first embodiment of the present invention. As shown in FIG. 1, the piezoelectric thin film element includes a base layer 2, a piezoelectric thin film 3, and an electrode 4 sequentially formed on a substrate 1.

Si (silicon) substrate, surface oxide film-attached Si substrate having an oxide film on the surface of the Si substrate, or SOI (Silicon on Insulator) substrate is preferably used as the substrate 1. For example, (100) Si substrate with its surface oriented (100) direction is used as the Si substrate. However, Si substrate with different plane orientation from the (100) plane may also be used. Further, quartz glass substrate, GaAs substrate, sapphire substrate, a metal substrate such as stainless, MgO substrate, and $SrTiO_3$ substrate, etc., may also be used as the substrate 1.

Preferably, the base layer 2 is made of Pt (platinum) layer, and is preferentially oriented in (111) plane direction. For example, the Pt layer formed on the Si substrate is easily oriented in (111) plane direction, due to its self-orientation performance. As a material of the base layer 2, an alloy including Pt, Au (gold), Ru(ruthenium), Ir (iridium), or metal oxides such as $SrTiO_3$ and $LaNiO_3$ may be used. The base layer 2 is formed using a sputtering method and a vapor deposition method. Note that in order to obtain a high adhesion between the substrate 1 and the base layer 2, an adhesive layer may be provided between the substrate 1 and the base layer 2. The base layer 2 can be used as an electrode (lower electrode).

The piezoelectric thin film 3 is a KNN piezoelectric thin film having an alkali niobium oxide-based perovskite structure represented by a composition formula $(K_{1-x}Na_x)_yNbO_3$, wherein the carbon concentration of the KNN piezoelectric thin film 3 is expressed by $2\times10^{19}/cm^3$ or less, or the hydrogen concentration of the KNN piezoelectric thin film 3 is expressed by $4\times10^{19}/cm^3$ or less. The KNN piezoelectric thin film 3 has a pseudo-cubic structure and is preferentially oriented in (001) plane direction. Further, compositions x, y of the KNN piezoelectric thin film 3 are preferably in a range of $0.40 \leqq x \leqq 0.7$ and $0.75 \leqq y \leqq 0.90$. The piezoelectric thin film 3 is formed by the sputtering method, CVD (Chemical Vapor Deposition) method, and sol gel method, etc., can be used.

The electrode 4 is formed by the sputtering method, the vapor deposition method, a plating method, and a metal paste method, using materials such as Pt, Au, Al (aluminum). The electrode 4 does not have a great influence on a crystal structure of the piezoelectric thin film like the base layer 2, and therefore the material and the crystal structure of the electrode 4 are not particularly limited.

As a result of examining a reason why the dielectric loss tan δ becomes high regarding the KNN thin film formed by the sputtering method, which is a most general method as a film forming method of the KNN thin film, it is found that carbon is mixed into the film with high concentration, which is the film of the KNN thin film having high tan δ. It is also found that a mixture source of the carbon is the carbon contained in a KNN sintered target. The KNN sintered target is usually formed through a process of a mixture, temporary sintering, and real sintering, using $K_2CO_3$, $N_{a2}CO_3$, $Nb_2O_5$ powder as starting raw materials. At this time, it appears that a most part of the carbon in the starting raw materials $K_2CO_3$ and $Na_2CO_2$ is removed in a sintering step at a high temperature, but a part of them remains in the KNN sintered compact.

In order to reduce the carbon concentration in the KNN thin film, it is effective to reduce the carbon concentration in the KNN sintered target, or increase a ratio of $O_2$ in atmosphere gas (for example, mixed gas of Ar (argon) and $O_2$ (oxygen)) during film formation by sputtering, and apply heat treatment thereto in the atmosphere or in oxygen atmosphere after film formation of the KNN thin film (see FIG. 8 in the example as will be described later).

The carbon concentration in the KNN thin film can be measured by a general SIMS analysis for example. However, there is no guarantee that a correct concentration profile is obtained in the vicinity of a surface of a measured sample or in the vicinity of an interface between the sample and a layer adjacent to the sample. Therefore, in this embodiment, the carbon concentration in a range of the KNN piezoelectric thin film 3 is regarded as a correct carbon concentration, which is the range excluding a range of 200 nm in a depth direction from the interface between the KNN piezoelectric thin film 3 and the base layer 2 being the layer adjacent to the KNN piezoelectric thin film 3, and a range of 200 nm in the depth direction from the surface of the KNN piezoelectric thin film 3, and a range of 200 nm in the depth direction from the interface between the KNN piezoelectric thin film 3 and the electrode 4, to thereby obtain the carbon concentration in the KNN piezoelectric thin film 3. The hydrogen concentration of the KNN piezoelectric thin film 3 is similarly obtained by the SIMS analysis.

As a result of measuring a depth direction profile of the carbon concentration and tan δ regarding the KNN thin film with compositions x, y in the range of $0.4 \leqq x \leqq 0.7$ and $0.75 \leqq y \leqq 0.90$ and having the pseudo-cubic crystal perovskite structure preferentially oriented in (001) plane direction, it is found that tan δ 0.1 is achieved when the carbon concentration is $2\times10^{19}/cm^3$ or less (see FIG. 7 in the example as will be described later).

Further, as a result of measuring the depth direction profile of the hydrogen concentration simultaneously with the carbon concentration by the SIMS analysis, it is also found that the hydrogen concentration and the carbon concentration in the KNN thin film show the profile of approximately the same tendency. Regarding the hydrogen concentration of the KNN thin film, it is also found that tan δ 0.1 is achieved when the hydrogen concentration is expressed by $4\times10^{19}/cm^3$ or less (see FIG. 7 in the example as will be described later).

Regarding the KNN thin film formed by a film forming method other than the sputtering method (for example, CVD method and sol gel method), although there is a slight difference in film forming conditions, carbon and hydrogen are mixed into the KNN thin film with high concentration, and the KNN thin film satisfying tan δ 0.1 is achieved by setting the carbon concentration to $2\times10^{19}/cm^3$ or less, or setting the hydrogen concentration to $4\times10^{19}/cm^3$ or less.

(Second Embodiment of the Piezoelectric Thin Film Element)

Figure 2:
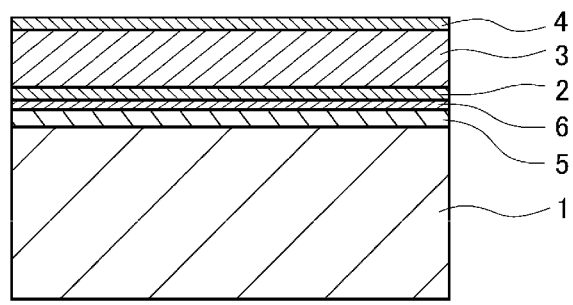
FIG. 2 is a schematic cross-sectional view of a structure of a piezoelectric thin film element according to a second embodiment of the present invention.

FIG. 2 shows a schematic cross-sectional structure of the piezoelectric thin film element according to a second embodiment of the present invention. Similarly to the piezoelectric thin film element according to the first embodiment shown in FIG. 1, the piezoelectric thin film element of the second embodiment has the base layer 2, the piezoelectric thin film 3, and the electrode 4 on the substrate 1. However, the substrate 1 is the surface oxide film-attached substrate in which an oxide film 5 is formed on its surface, and an adhesive layer 6 is provided between the oxide film 5 and the base layer 2 to increase adhesion of the base layer 2.

The surface oxide film-attached substrate is for example a Si substrate to which an oxide film is attached, and in the surface oxide film-attached Si substrate, the oxide film includes a $SiO_2$ film formed by thermal oxidation, and a $SiO_2$ film formed by the CVD method. As a substrate size, usually a circular shape of 4 inches is used in many cases. However, a circular shape or a rectangular shape of 6 inches or 8 inches may also be used. Further, the adhesive layer 6 is formed by the sputtering method and the vapor deposition method using Ti (titanium) and Ta (tantalum).

Note that piezoelectric thin films 3 of the piezoelectric thin film elements according to the first and second embodiments are respectively the KNN thin film of a single layer. However, the piezoelectric thin film 3 may also be formed of a plurality of $(K_{1-x}Na_x)_yNbO_3$ (0<x<1) layers including the KNN thin film in which the carbon concentration is expressed by $2\times10^{19}/cm^3$ or less or the hydrogen concentration is expressed by $4\times10^{19}/cm^3$ or less, in a range of $0.40 \leqq x \leqq 0.70$ and $0.75 \leqq y \leqq 0.90$. Further, an element other than K (potassium), Na (sodium), Nb (niobium), O (oxygen), for example, Li (lithium), Ta (tantalum), Sb (antimony), Ca (calcium), Cu (copper), Ba (barium), Ti (titanium), etc., may be added by several atom % or less. In this case as well, a similar effect can be obtained. Further, a thin film made of an alkali niobium oxide-based material other than KNN or a material having the perovskite structure ($LaNiO_2$, $SrTiO_3$, $LaAlO_3$, $YAlO_3$, $BaSnO_3$, $BaMnO_2$, etc.,) may also be included between the base layer 2 and the electrode 4.

(Embodiments of the Piezoelectric Thin Film Device)

Figure 3:
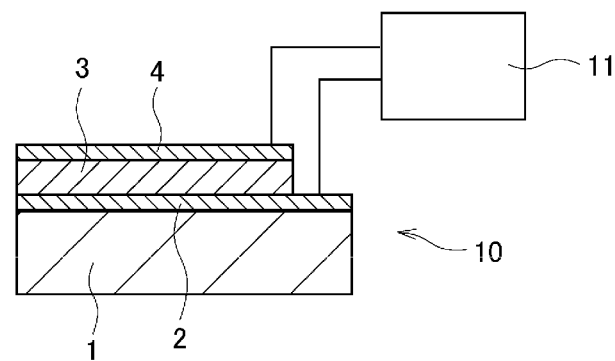
FIG. 3 is a schematic block diagram of an embodiment of a piezoelectric thin film device according to the present invention.

FIG. 3 shows a schematic block diagram of an embodiment of a piezoelectric thin film device fabricated using the piezoelectric thin film element according to the present invention.

As shown in FIG. 3, the piezoelectric thin film element 10 has a cross-sectional structure similar to the piezoelectric thin film element of the first embodiment shown in FIG. 1, wherein in the piezoelectric thin film element of the first embodiment, the base layer 2 is used as a lower electrode 2, and the electrode 4 is used as an upper electrode 4. In the piezoelectric thin film device, at least a voltage detector (or a function generator) 11 is connected between the lower electrode 2 and the upper electrode 4 of the piezoelectric thin film element 10 formed into a prescribed shape.

A sensor as the piezoelectric thin film device is obtained by connecting the voltage detector 11 between the lower electrode 2 and the upper electrode 4. When the piezoelectric thin film element 10 of this sensor is deformed by a change of some physical quantity, voltage is generated by such a deformation, and therefore each kind of physical quantity can be measured by detecting the voltage by the voltage detector 11. For example, a gyro sensor, an ultrasonic sensor, a pressure sensor, a speed/acceleration sensor, etc., can be given as the sensor.

Further, the actuator being the piezoelectric thin film device, is obtained by connecting the function generator between the lower electrode 2 and the upper electrode 4 of the piezoelectric thin film element 10. Each kind of members can be operated by applying voltage to the piezoelectric thin film element 10 of the actuator, and deforming the piezoelectric thin film element 10. The actuator can be used for an inkjet printer, a scanner, and an ultrasonic generator, etc., for example.

EXAMPLES

Specific examples of the present invention will be described next.

The piezoelectric thin film element of an example and a comparative example has a cross-sectional structure similar to that of the second embodiment shown in FIG. 2, wherein Ti adhesive layer, Pt lower electrode (base layer), KNN piezoelectric thin film, and Pt upper electrode (electrode) are laminated on the Si substrate having a thermal oxide film.

[Film Formation of the KNN Piezoelectric Thin Film]

A film formation method of the KNN piezoelectric thin film according to the example and the comparative example will be described hereafter.

The thermal oxide film-attached Si substrate ((100) plane orientation, thickness: 0.525 mm, shape: circular shape of 4 inches, thickness of the thermal oxide film: 200 nm) was used as the substrate. First, the Ti adhesive layer (film thickness: 10 nm) and the Pt lower electrode ((111) plane preferential orientation, film thickness: 200 nm) was formed on the substrate by a RF magnetron sputtering method. The Ti adhesive layer and the Pt lower electrode were formed under conditions of substrate temperature: 350° C., discharge power: 300 W, introduced gas: Ar, pressure of Ar atmosphere: 2.5 Pa, film formation time: 3 minutes for the Ti adhesive layer, and 10 minutes for the Pt lower electrode.

Subsequently, $(K_{1-x}Na_x)_yNbO_3$ piezoelectric thin film having the film thickness of 3 μm was formed on the Pt lower electrode by the RF magnetron sputtering method. The $(K_{1-x}Na_x)_yNbO_3$ piezoelectric thin film was formed using $(K_{1-x}Na_x)_yNbO_3$ sintered compact as a target, wherein y=(K+Na)/Nb ratio=0.86 to 1.05, x=Na/(K+Na) ratio=0.44 to 0.78, which was formed under conditions of substrate temperature (temperature of the substrate surface): 550° C., discharge power: 75 W, introduced gas $Ar/O_2$ mixed gas ($Ar/O_2$=99/1 to 90/10), pressure of atmosphere gas: 1.3 Pa. The sputtering film formation time of each KNN thin film was adjusted so that the film thickness of the KNN thin film was approximately 3 μm.

The KNN sintered target was fabricated by using $K_2CO_3$ powder, $Na_2CO_3$ powder, $Nb_2O_5$ powder as raw materials, mixing them for 24 hours using a ball mill, temporarily sintering them at 850° C. for 10 hours, then pulverizing them again by the ball mill, and molding them under pressure of 200 MPa, and sintering them at 1000 to 1250° C. The (K+Na)/Nb ratio and Na/(K+Na) ratio were controlled by adjusting the mixing ratio of the $K_2CO_3$ powder, $Na_2CO_3$ powder, $Nb_2O_5$ powder. In the fabricated sintered target, atom % of K, Na, Nb was measured by EDX (Energy Dispersive X-ray spectroscopy) before being used for sputtering film formation, and the (K+Na)/Nb ratio and the Na/(K+Na) ratio were calculated respectively. Further, the carbon concentration and the hydrogen concentration (wt ppm) in the sintered target were measured by Interstitical Gas Analysis (IGA). The gas analysis is a method of measuring a gas component such as C, N, O, H generated by burning a material by infrared absorption and thermal conductimetry measurement, to thereby determine the concentration.

The carbon concentration and the hydrogen concentration in the KNN sintered target were reduced, as the sintering temperature was higher. FIG. 8 shows the (K+Na)/Nb ratio and Na/(K+Na) ratio, a target sintering temperature, the carbon concentration and the hydrogen concentration included in the target, $Ar/O_2$ ratio during film formation by sputtering, and presence/absence of the heat treatment after film formation, in the KNN sintered target used in examples 1 to 10 and comparative examples 1 to 8. The heat treatment was applied to the KNN thin film after film formation in the atmosphere at 750° C. for two hours.

[Composition Analysis of the KNN Piezoelectric Thin Film]

Composition analysis of the KNN thin film of examples 1 to 10 and comparative examples 1 to 8 was performed by ICP-AES (inductive coupling plasma emission analysis method). The sample was set in a solution state using a wet acidolysis, and a mixture solution of hydrofluoric acid and nitric acid was used for acid. The (K+Na)/Nb ratio and Na/(K+Na) ratio were calculated from the ratio of Nb, Na, and K obtained by ICP-AES. FIG. 8 shows the calculated (K+Na)/Nb ratio and Na/(K+Na) ratio. It is found that the KNN piezoelectric thin film having different (K+Na)/Nb ratio can be fabricated by using the target having different (K+Na)/Nb ratio.

[Measurement of a Depth Direction Concentration Profile of Carbon and Hydrogen in the KNN Piezoelectric Thin Film]

Figure 4:
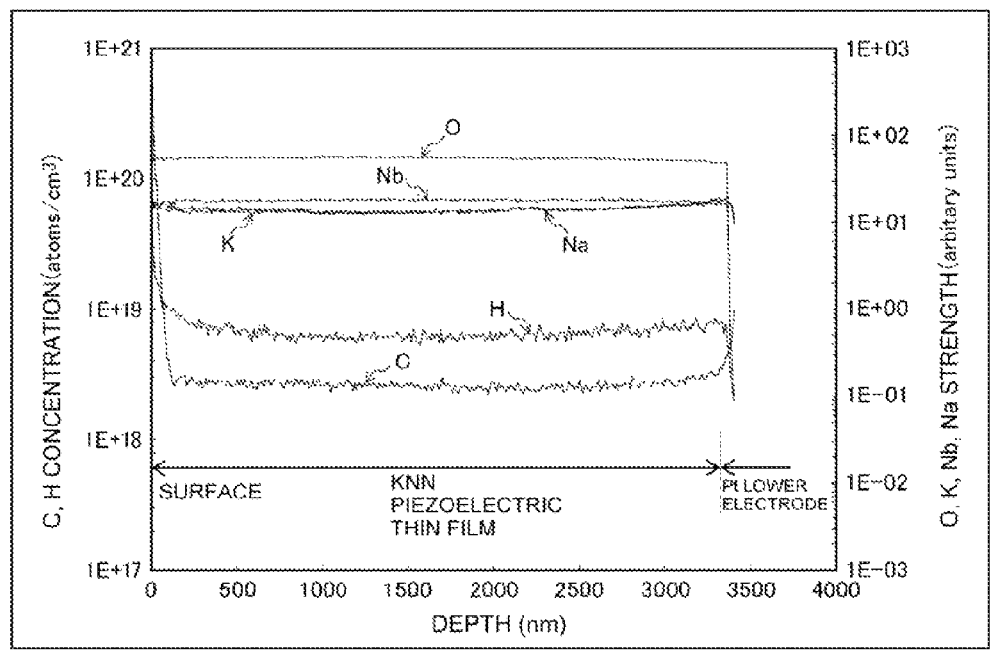
FIG. 4 is a graph showing carbon concentration, hydrogen concentration, and a depth direction profile of strength of O, K, Nb, Na, obtained by measuring a KNN thin film of an example of the present invention by SIMS analysis.
Figure 5:
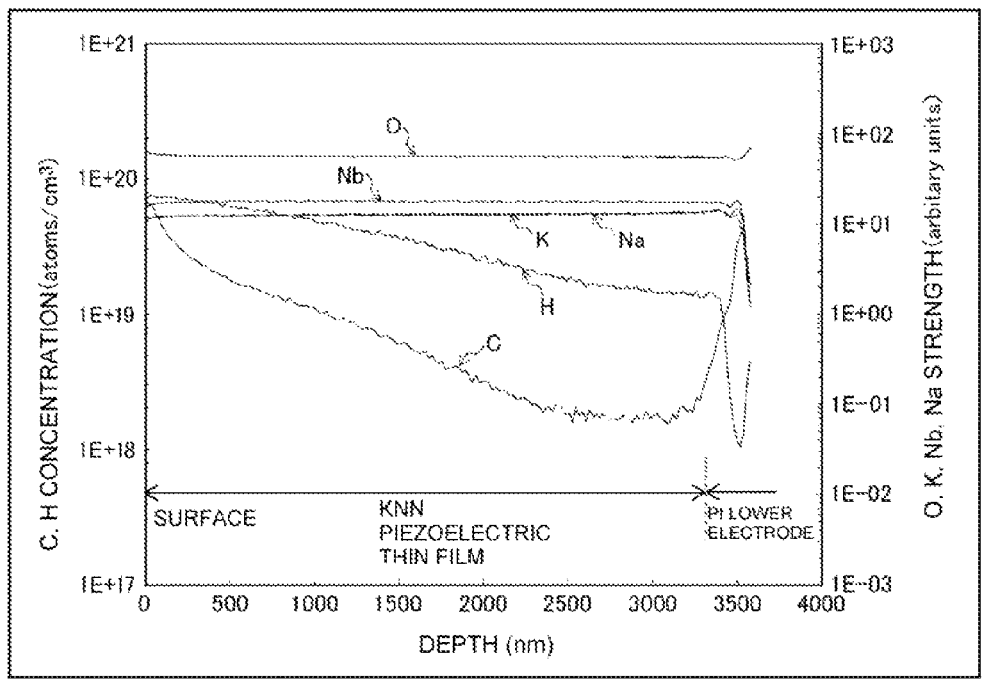
FIG. 5 is a graph showing carbon concentration, hydrogen concentration, and a depth direction profile of the strength of O, K, Nb, Na, obtained by measuring a KNN thin film of a comparative example of the present invention by SIMS analysis.

By a general Secondary Ion Mass Spectrometry (SIMS), a depth direction concentration profile of carbon and hydrogen was measured from a surface side of the KNN piezoelectric thin film to the Pt lower electrode. FIG. 4 shows a case of example 1, and FIG. 5 shows a case of comparative example 1, as an example of a measurement result. FIG. 4 and FIG. 5 also show the depth direction profile of the strength of O, K, Nb, Na of the KNN piezoelectric thin film. In comparative example 1, as shown in FIG. 5, the concentration of the carbon and hydrogen is higher on the surface side of the KNN piezoelectric thin film, and the concentration is gradually reduced toward the Pt lower electrode side. Meanwhile, in example 1, as shown in FIG. 4, there are areas where concentrations of the carbon and hydrogen are higher in the vicinity of the surface and in the vicinity of the interface between the KNN piezoelectric thin film 3 and the Pt lower electrode. However, in the area other than these areas, the concentrations of the carbon and hydrogen are extremely low, and the concentrations are set in approximately a fixed state.

In the SIMS analysis, it is said that the concentration cannot be correctly measured in the vicinity of the surface (in an area within 200 nm of depth from the surface) under various influences. Further, the concentration profile in a depth direction is measured by SIMS analysis while scraping a film by ion etching. Therefore, flatness of a measured plane is lost in a deep area, and as a result, there is a possibility that a resolving power in a depth direction is reduced. Accordingly, it is considered that the concentration cannot be correctly measured in the vicinity of the interface (the KNN thin film in an area within 200 nm from the Pt lower electrode interface) with the base layer (Pt lower electrode in this example). Therefore, a maximum value of the concentration was read in the depth direction concentration profile of the carbon and hydrogen of the KNN thin film, in a range of a depth in which the result of the SIMS analysis was reliable (an area excluding the area within a depth of 200 nm from the surface of the KNN thin film and the area within 200 nm from the Pt lower electrode interface). FIG. 8 shows the maximum values of the carbon concentration and the hydrogen concentration of the KNN thin film in examples 1 to 10 and comparative examples 1 to 8.

As shown in FIG. 8, the carbon concentration and the hydrogen concentration in the KNN sintered target can be reduced by increasing a sintering temperature of the KNN sintered target. It appears that this is because by performing sintering at a high temperature, the carbon concentration and the hydrogen concentration remained in the KNN sintered target are reduced. Further, the carbon concentration and the hydrogen concentration in the formed KNN thin film are also reduced by using the KNN sintered target having low carbon concentration and hydrogen concentration. Further, the carbon concentration and the hydrogen concentration in the KNN thin film are reduced by increasing the ratio of $O_2$ in $Ar/O_2$ ratio during film formation by sputtering. In addition, the carbon concentration and the hydrogen concentration in the KNN thin film are reduced by the heat treatment after film formation.

[Dielectric Loss Tan $\delta$, Measurement of Dielectric Constant]

Figure 6:
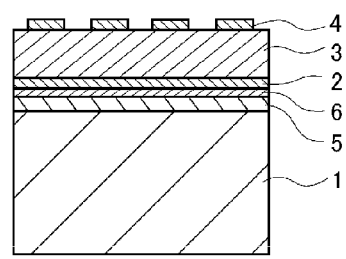
FIG. 6 is a schematic cross-sectional view of a structure fabricated when a dielectric loss tan δ of the KNN thin film is measured, which is the KNN thin film of the example and the comparative example.

In order to measure the dielectric constant and the dielectric loss tan $\delta$ of the KNN piezoelectric thin film, as shown in FIG. 6, Pt upper electrode (film thickness: 100 nm, size: 1 mm×1 mm) 4 was formed on the KNN piezoelectric thin film 3 of the aforementioned examples and comparative examples by RF magnetron sputtering. The upper electrode 4 and the lower electrode 2 were connected to a LCR meter, and electrostatic capacity and tan $\delta$ were measured at a measurement frequency of 1 kHz. From the obtained electrostatic capacity, the dielectric constant was calculated in consideration of an electrode area (1 $mm^2$), the film thickness (3 μm) of the KNN piezoelectric thin film 3, and the dielectric constant in a vacuum state. FIG. 8 shows the dielectric constant and tan $\delta$ of the KNN thin film in examples 1 to 10 and comparative examples 1 to 8.

[Relation Between Tan $\delta$ and the Carbon Concentration, Hydrogen Concentration in the KNN Thin Film]

Figure 7:
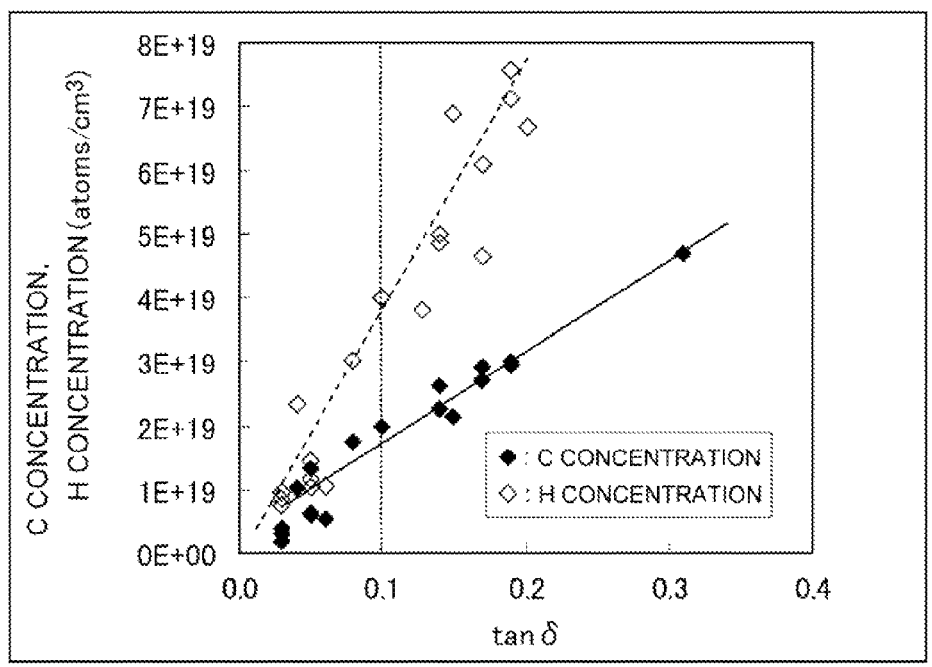
FIG. 7 is a graph showing a relation between tan δ of the KNN thin film of the example and the comparative example, and maximum values of the carbon concentration and the hydrogen concentration.

FIG. 7 shows a relation between tan $\delta$ of the KNN thin film and the maximum values of the carbon concentration and the hydrogen concentration in the KNN thin film. The carbon concentration and the hydrogen concentration show approximately the same tendency with respect to tan $\delta$, and logarithmic values of the carbon concentration and the hydrogen concentration are increased in proportion to increase of tan $\delta$. As shown in FIG. 7, the KNN thin film satisfying tan $\delta \leq 0.1$ is achieved by setting the carbon concentration to $2 \times 10^{19}/cm^3$ or less, or setting the hydrogen concentration to $4 \times 10^{19}/cm^3$ or less, in the KNN piezoelectric thin film.

Regarding the dielectric constant, there is almost no difference between the KNN thin film of the examples in which the carbon concentration is $2 \times 10^{19}/cm^3$ or less and the hydrogen concentration is $4 \times 10^{19}/cm^3$ or less, and the KNN thin film of comparative examples in which the carbon concentration exceeds $2 \times 10^{19}/cm^3$ and the hydrogen concentration exceeds $4 \times 10^{19}/cm^3$. Further, regarding the piezoelectric constant as well, there is almost no difference between the KNN thin film of comparative examples and the KNN thin film of examples. Namely, it is found that in the KNN thin film of examples, values of tan $\delta$, which are a problem, can be reduced, while maintaining satisfactory piezoelectric constant and dielectric constant which are equivalent to conventional ones.

[Prototype of the Actuator and Evaluation of Characteristics]

A cantilever type simple actuator was produced experimentally using the KNN piezoelectric thin film of the aforementioned example 1 and comparative example 1. First, in such an experimental production, the Pt upper electrode was formed on the KNN piezoelectric thin film of the aforementioned example 1 and comparative example 1 by RF magnetron sputtering, and thereafter was cut into a short strip-like shape, to thereby fabricate the piezoelectric thin film element having the KNN piezoelectric thin film. Next, one end of the strip-like piezoelectric thin film element in its longitudinal direction was fixed by a clamp, to thereby fabricate a simple unimorph cantilever. Voltage was applied by the function generator, to the KNN piezoelectric thin film between the Pt upper electrode and the Pt lower electrode of the cantilever, and the KNN piezoelectric thin film was stretched, to thereby bend and stretch an overall cantilever (piezoelectric thin film element). Displacement $\Delta$ of the tip end of the cantilever at this time was measured by a Laser Doppler displacement meter. Piezoelectric constant $d_{31}$ was calculated by displacement $\Delta$ of the tip end of the cantilever, length of the cantilever, thickness and Young modulus of the substrate 1 and the KNN piezoelectric thin film 3, and application voltage.

Unipolar sine wave was continuously applied between upper and lower electrodes of the actuator (cantilever) using the KNN piezoelectric thin film of example 1, and the actuator (cantilever) using the KNN piezoelectric thin film of comparative example 1, to thereby continuously drive the cantilever. At this time, in the actuator of example 1, it was confirmed that heat generation was suppressed compared with the actuator of comparative example 1. Further, the ratio (decreasing rate, deteriorating rate) of decreasing the piezoelectric constant $d_{31}$ after drive of 100 million times, from initial piezoelectric constant $d_{31}$ can also be suppressed in the actuator of example 1, more than the actuator of comparative example 1.

Other Example

In the aforementioned example, the Pt layer which also functioned as the lower electrode, was used as the base layer. However, for example $NaNbO_3$ layer is formed on the Pt layer, and the base layer may be formed of two layers of the Pt layer and the $NaNbO_3$ layer. Further, a filter device utilizing a surface elastic wave can be formed by forming the KNN piezoelectric thin film on the substrate, and forming the electrode provided with a prescribed pattern on the piezoelectric thin film. In a case of a device not requiring the lower electrode like the filter device utilizing the surface elastic wave, the Pt layer is not used as the lower electrode but is used as the base layer, or other base layer may be provided instead of the Pt layer. For example, a device structure may be formed by laminating a nickel lanthanate layer being the base layer, the KNN piezoelectric thin film, and an upper pattern electrode.

Brief Description of Signs and Numerals
1 Substrate
2 Base layer (lower electrode)
3 Piezoelectric thin film (KNN piezoelectric thin film)
4 Electrode (upper electrode)
5 Oxide film
6 Adhesive layer
10 Piezoelectric thin film element
11 Voltage detector or function generator

The invention claimed is:
1. A piezoelectric thin film element, comprising:
a substrate; and
a piezoelectric thin film having an alkali niobium oxide-based perovskite structure represented by a composition formula $(K_{1-x}Na_x)_yNbO_3$ (satisfying $0.4 \leq x \leq 0.7$ and $0.75 \leq y \leq 0.90$) provided on the substrate,
wherein a carbon concentration of the piezoelectric thin film is $2 \times 10^{19}/cm^3$ or less, and a hydrogen concentration is $4 \times 10^{19}/cm^3$ or less.

2. The piezoelectric thin film element according to claim 1, wherein the piezoelectric thin film has a pseudo-cubic structure and is preferentially oriented in (001) plane direction.

3. The piezoelectric thin film according to claim 2, wherein a base layer is provided between the substrate and the piezoelectric thin film.

4. The piezoelectric thin film according to claim 3, wherein the base layer is a Pt layer, and the Pt layer is preferentially oriented in (111) plane direction.

5. The piezoelectric thin film according to claim 2, wherein the substrate is a Si substrate, a surface oxide film-attached Si substrate, or a SOI substrate.

6. A piezoelectric thin film device, comprising:
the piezoelectric thin film element of claim 2;
an upper electrode and a lower electrode provide in an upper part and in a lower part, with the piezoelectric thin film of the piezoelectric thin film element interposed between them; and
a function generator or a voltage detector connected between the upper electrode and the lower electrode.

7. The piezoelectric thin film according to claim 1, wherein a base layer is provided between the substrate and the piezoelectric thin film.

8. The piezoelectric thin film according to claim 7, wherein the base layer is a Pt layer, and the Pt layer is preferentially oriented in (111) plane direction.

9. The piezoelectric thin film according to claim 1, wherein the substrate is a Si substrate, a surface oxide film-attached Si substrate, or a SOI substrate.

10. A piezoelectric thin film device, comprising:
the piezoelectric thin film element of claim 1;
an upper electrode and a lower electrode provide in an upper part and in a lower part, with the piezoelectric thin film of the piezoelectric thin film element interposed between them; and
a function generator or a voltage detector connected between the upper electrode and the lower electrode.

* * * * *